(12) United States Patent
Zhang et al.

(10) Patent No.: US 8,656,590 B2
(45) Date of Patent: Feb. 25, 2014

(54) METHOD FOR MANUFACTURING HEAT DISSIPATING APPARATUS

(75) Inventors: Jing Zhang, Shenzhen (CN); Jian Liu, Shenzhen (CN); Xing-Hua He, Shenzhen (CN)

(73) Assignees: Fu Zhun Precision Industry (Shen Zhen) Co., Ltd., Shenzhen (CN); Foxconn Technology Co., Ltd., New Taipei (TW)

( * ) Notice: Subject to any disclaimer, the term of this patent is extended or adjusted under 35 U.S.C. 154(b) by 377 days.

(21) Appl. No.: 13/189,584

(22) Filed: Jul. 25, 2011

(65) Prior Publication Data

US 2012/0317811 A1    Dec. 20, 2012

(30) Foreign Application Priority Data

Jun. 15, 2011    (CN) .......................... 2011 1 0159752

(51) Int. Cl.
*B21D 39/06*    (2006.01)

(52) U.S. Cl.
USPC ..................... 29/890.043; 29/890.03; 29/508

(58) Field of Classification Search
USPC .............. 29/890.03–890.054, 726, 727, 506, 29/508; 163/1–7
See application file for complete search history.

(56) References Cited

U.S. PATENT DOCUMENTS

| | | | | |
|---|---|---|---|---|
| 1,793,293 A | * | 2/1931 | Varney et al. | 403/284 |
| 2,057,244 A | * | 10/1936 | Maynes | 29/34 R |
| 4,574,444 A | * | 3/1986 | Humpolik | 29/890.043 |
| 5,406,698 A | * | 4/1995 | Lipinski | 29/727 |
| 6,758,262 B2 | * | 7/2004 | Kawabata et al. | 165/80.3 |
| 7,077,188 B2 | * | 7/2006 | Chen | 165/80.3 |
| 7,120,026 B2 | * | 10/2006 | Chen | 361/704 |
| 2006/0070721 A1 | * | 4/2006 | Chen | 165/80.3 |
| 2009/0145580 A1 | * | 6/2009 | Lin et al. | 165/80.3 |
| 2011/0290467 A1 | * | 12/2011 | Huang | 165/182 |
| 2012/0186786 A1 | * | 7/2012 | Zhang et al. | 165/104.26 |

* cited by examiner

*Primary Examiner* — David Bryant
*Assistant Examiner* — Jacob Cigna
(74) *Attorney, Agent, or Firm* — Altis Law Group, Inc.

(57) ABSTRACT

An exemplary method for manufacturing a heat dissipation apparatus includes, firstly, providing a fin assembly including a stack of fins spaced from each other. Each fin defines a through hole therein, and includes a collar formed at an edge of the through hole. Then a heat pipe is provided, and inserted in the through holes of the fins. Next, two opposing punching tools are provided. Each punching tool defines a series of recesses. The subassembly of the heat pipe and fins is positioned between the two punching tools, with the collar of each fin located between two corresponding recesses of the two punching tools. The two punching tools punch the collars of the fins from two opposite sides of the collars. Thereby, the collars shrink inwardly and press the heat pipe to deform until the heat pipe is fittedly mounted in the collars of the fins.

12 Claims, 7 Drawing Sheets

METHOD FOR MANUFACTURING HEAT DISSIPATING APPARATUS

BACKGROUND

1. Technical Field

The present disclosure generally relates to methods for manufacturing heat dissipation apparatuses, and particularly to a method for manufacturing a heat dissipation apparatus having a heat pipe.

2. Description of Related Art

With developments in electronics technology, increased performance of electronic components such as CPUs (central processing units) has been achieved. However, such electronic components generate increased levels of heat, which must be dissipated promptly. Conventionally, a heat dissipation apparatus which includes a fin assembly combined with a heat pipe is used to remove the heat generated by the electronic component.

The fin assembly includes a plurality of fins. Each fin defines a through hole therein, for extending of the heat pipe therethrough. In order to ensure a high heat conductive efficiency between the heat pipe and the fins, typically, the heat pipe is soldered in the through holes of the fins through a soldering process. However, solder is typically composed of a lot of heavy metals, such as lead, tin or others, which if mishandled can cause permanent damage to humans or the environment.

Therefore, what is needed is a method for manufacturing a heat dissipation apparatus which can overcome the described limitations.

DETAILED DESCRIPTION

Figure 1:
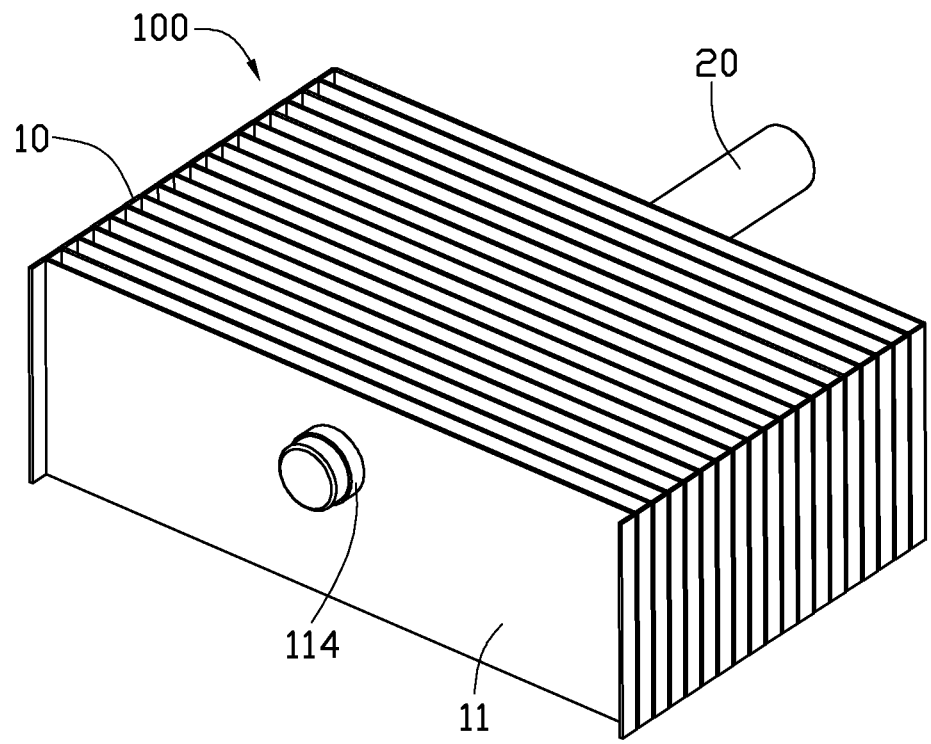
FIG. 1 is an isometric, assembled view of a heat dissipation apparatus manufactured by a method in accordance with a first embodiment of the present disclosure.

Referring to FIG. 1, a heat dissipation apparatus 100 manufactured through a manufacturing method in accordance with a first embodiment of the present disclosure is shown. The heat dissipation apparatus 100 includes a fin assembly 10, and a heat pipe 20 extending through the fin assembly 10.

The fin assembly 10 includes a plurality of plate-shaped metallic fins 11 stacked together and spaced apart from each other at constant intervals. An air passage is defined between every two adjacent fins 11. Each of the fins 11 is rectangular and defines a through hole 112 therein, for extending of the heat pipe 20 therethrough. The through holes 112 are circular. An annular collar 114 extends perpendicularly from each fin 11 at an edge of the through hole 112. The heat pipe 20 is interferentially fixed in the collar 114 of each fin 11 (see below).

Figure 2:
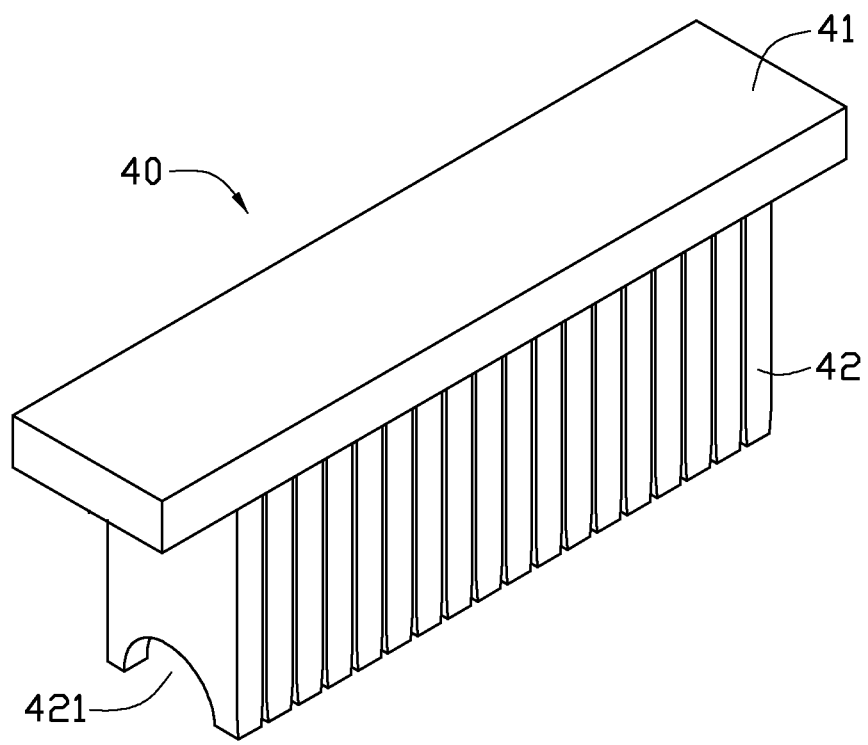
FIG. 2 is an isometric view of a punching tool used in the method of the first embodiment.
Figure 3:
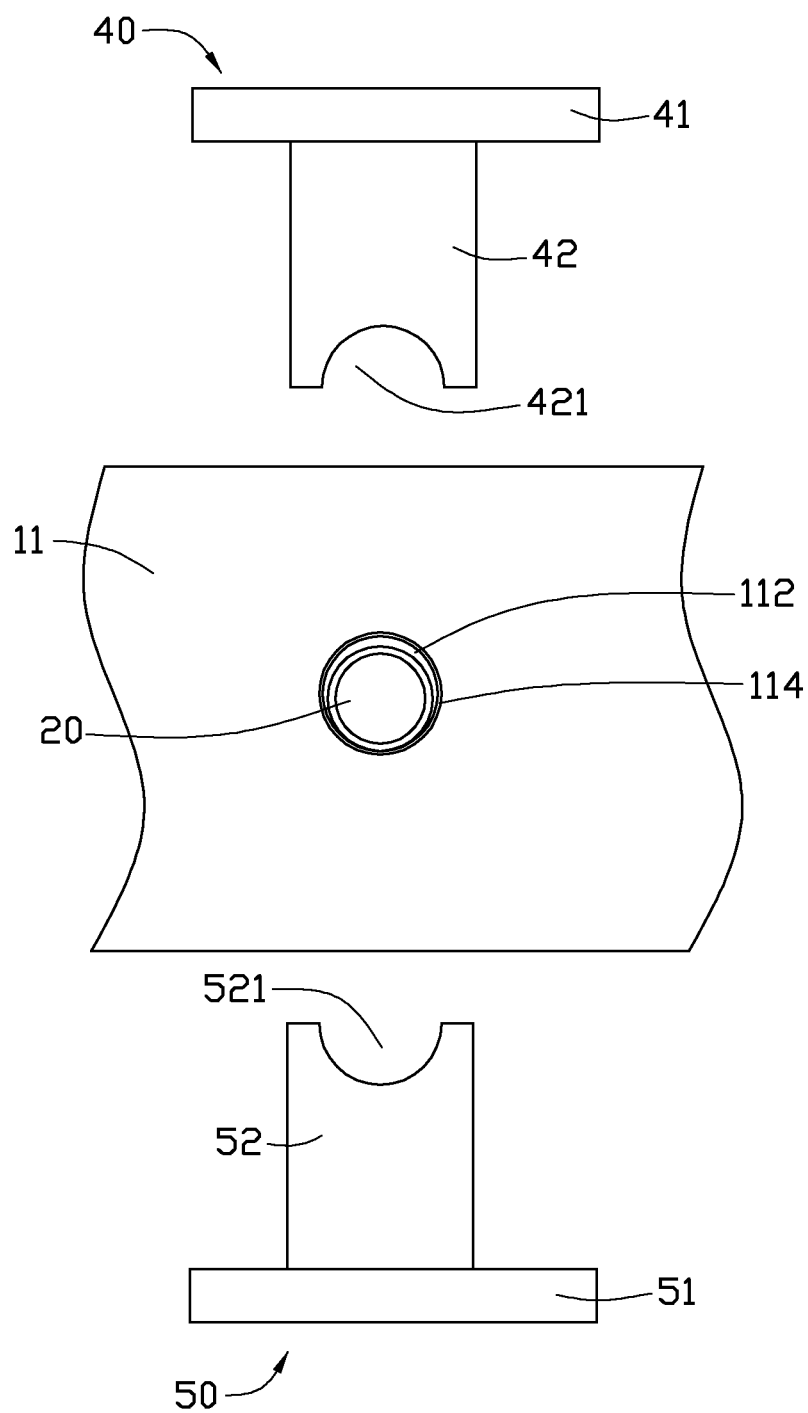
FIGS. 3-5 are schematic, front views illustrating sequential steps of the method for manufacturing the heat dissipation apparatus of FIG. 1.

Referring also to FIGS. 2 and 3, during manufacturing of the heat dissipation apparatus 100, a first punching tool 40, a second punching tool 50 and a punching process are applied. The first punching tools 40 includes a handle portion 41, and a plurality of punching units 42 extending downwardly from the handle portion 41. The handle portion 41 is strip-shaped. The punching units 42 are evenly spaced from each other along a longitudinal direction of the handle portion 41. A distance between every two adjacent punching units 42 exceeds a thickness of each fin 11. Each of the punching units 42 is rectangular, and has a thickness less than a distance between every two adjacent fins 11. A free end of each punching unit 42 away from the handle portion 41 defines a recess 421 therein. The recess 421 has an arc-shaped edge. The second punching tool 50 is substantially identical to the first punching tool 40. That is, the second punching tool 50 includes a handle portion 51 and a plurality of punching units 52 formed on the handle portion 51, with each of the punching units 52 defining a recess 521 therein.

Referring to FIG. 3, before the punching process, the heat pipe 20 has a circular cross section. An outer diameter of the heat pipe 20 is less than a diameter of the through hole 112 of each fin 11, and less than an inner diameter of the collar 114 of each fin 11, in order that the heat pipe 20 can be loosely inserted in the through hole 112 and the collar 114 of the fin 11. Typically, the diameter of the heat pipe 20 is 80% to 99% of the diameter of the through hole 112 of the fin 11 (or the inner diameter of the collar 114) before the punching process. In this embodiment, the diameter of the heat pipe 20 is substantially 90% of the diameter of the through hole 112 of the fin 11 (or the inner diameter of the collar 114) before the punching process. The first punching tool 40 and the second punching tool 50 are spaced from each other. The recess 421 of the punching unit 42 of the first punching tool 40 faces the recess 521 of a corresponding punching unit 52 of the second punching tool 50. The fin assembly 10 is disposed between the first punching tool 40 and the second punching tool 50. By this arrangement, the collar 114 of each fin 11 is located between the recesses 421, 521 of corresponding punching units 42, 52 of the first punching tool 40 and the second punching tool 50.

Figure 4:
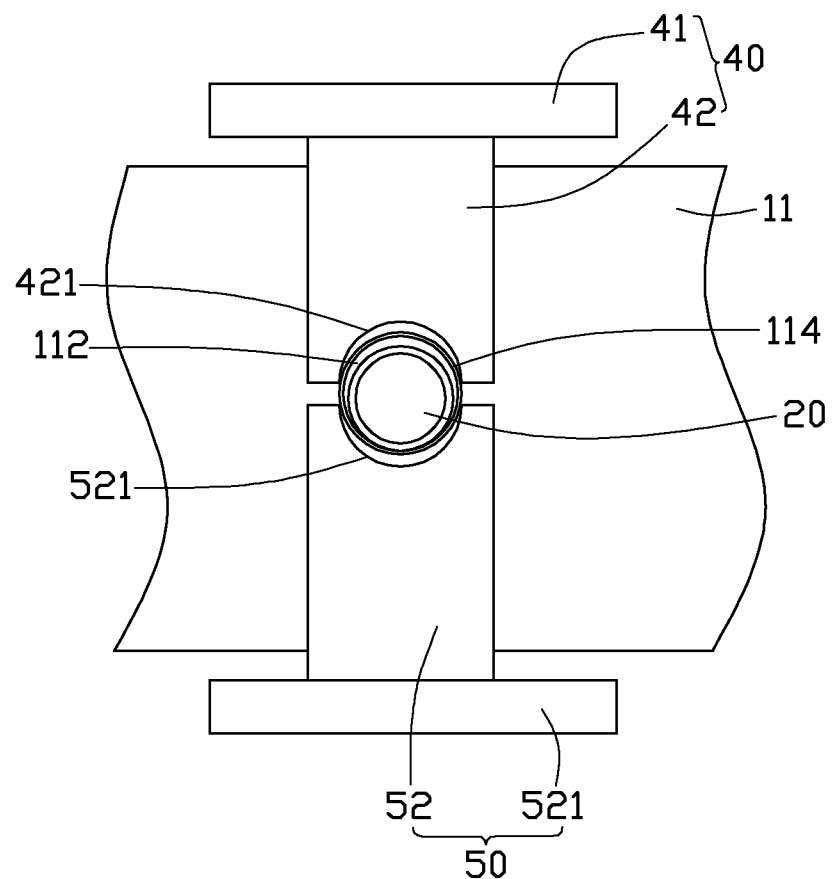
Figure 5:
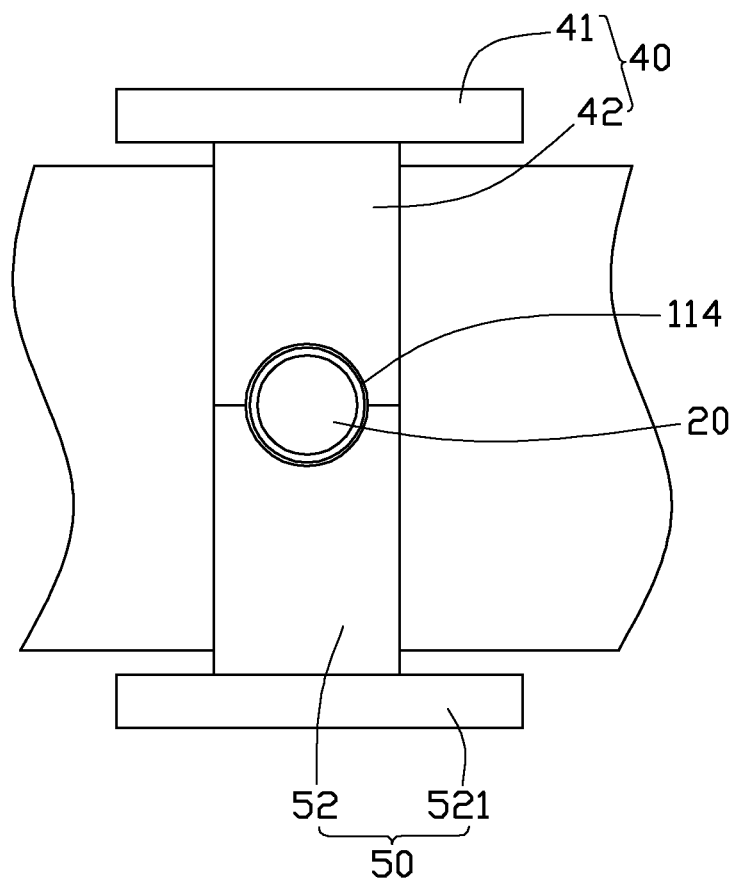

Referring to FIGS. 4 to 5, during the punching process, each of the first punching tool 40 and the second punching tool 50 is driven by a punch (not shown) to move toward the fin assembly 10. The punching units 42, 52 of the first and second punching tools 40, 50 respectively enter the air passages between the fins 11 of the fin assembly 10 from two opposite directions to punch the collars 114 of the fins 11. Each corresponding two punching units 42, 52 of the first punching tool 40 and second punching tool 50 punch a corresponding collar 114 of the fin 11 from two opposite sides of the collar 114. The collar 114 shrinks inwardly due to the impact of the corresponding punching units 42, 52 of the first and second punching tools 40, 50 to cause an inner surface of the collar 114 to press a periphery of the heat pipe 20. At the same time, the heat pipe 20 deforms correspondingly due to pressing of the collar 114 to enhance the contact between the inner surface of the collar 114 and the heat pipe 20. When the inner surface of the collar 114 closely contacts the entire periphery of the heat pipe 20 in this way, the punching process is completed. At this time, the heat pipe 20 is fittedly mounted in the collar 114 of each fin 11, and the first punching tool 40 and second punching tool 50 are moved away from the heat dissipation apparatus 100.

In this embodiment, the recesses 42, 52 of the first and second punching tools 40, 50 are semicircular. Before the punching process, an inner diameter of the recess 42 or 52 is smaller than an outer diameter of the collar 114 but larger than an outer diameter of the heat pipe 20, as shown in FIG. 4. When the recesses 421, 521 of the corresponding punching units 42, 52 of the first and second punching tools 40, 50 cooperatively define a round hole, the heat pipe 20 is fittedly mounted in the collar 114 of each fin 11 and the inner surface of the collar 114 of each fin 11 closely contacts the entire corresponding periphery of the heat pipe 20. Understandably, in other embodiments, the recesses 421, 521 of the punching tools 40, 50 can instead be, for example, arch-shaped or semi-elliptical.

According to above description, in the method for manufacturing the heat dissipation apparatus 100, each collar 114 of the fin 11 is punched by the first punching tool 40 and the second punching tool 50 from two opposite directions. The collar 114 shrinks and the heat pipe 20 deforms, so as to cause the heat pipe 20 to be fittedly mounted in the collar 114 of each fin 11 through an interference fit rather than through, e.g., soldering. This avoids the use of solder comprised of heavy metals.

In addition, during the punching process of the manufacturing method for the heat dissipation apparatus 100, the heat pipe 20 is fittedly mounted in the collar 114 of each fin 11 with the heat pipe 20 deforming only slightly. This avoids damage to an inner structure of the heat pipe 20 which may otherwise be caused by, e.g., directly punching the heat pipe 20 and significantly deforming the heat pipe 20.

Furthermore, the method for manufacturing the heat dissipation apparatus 100 causes the collar 114 of each fin 11 to totally contact the heat pipe 20. This helps avoid loosening of the contact surface between the fins 11 and the heat pipe 20. In turn, this advantageously promotes a heat conductive efficiency between the fins 11 and the heat pipe 20. In other words, a heat dissipation efficiency of the heat dissipation apparatus 100 is enhanced.

Figure 6:
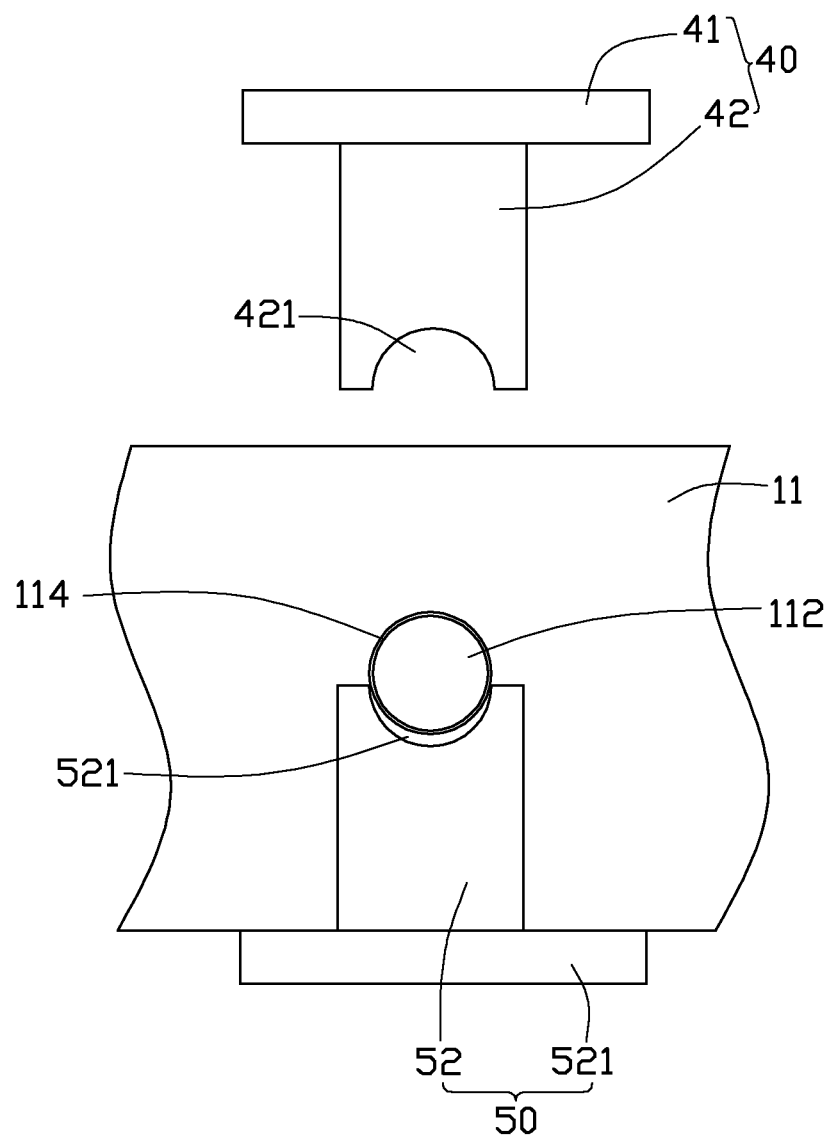
FIG. 6 is a schematic, front view illustrating a single step of a method for manufacturing the heat dissipation apparatus of FIG. 1 in accordance with a second embodiment of the present disclosure.

Referring to FIG. 6, this is a schematic view of a single step of a method for manufacturing the heat dissipation apparatus 100 in accordance with a second embodiment of the present disclosure. In this embodiment, the first punching tool 40 is placed above the second punching tool 50, and the fin assembly 10 is prefixed on the second punching tool 50. By this arrangement, each fin 11 of the fin assembly 10 is located between every two adjacent two punching units 52 of the second punching tool 50, and the collar 114 of each fin 11 is held in a recess 521 of a corresponding punching unit 52 of the second punching tool 50. The first punching tool 40 is driven by a punch (not shown) to punch the fin assembly 10 fixed on the second punching tool 50, similar to the procedure shown in FIG. 4 and FIG. 5.

Figure 7:
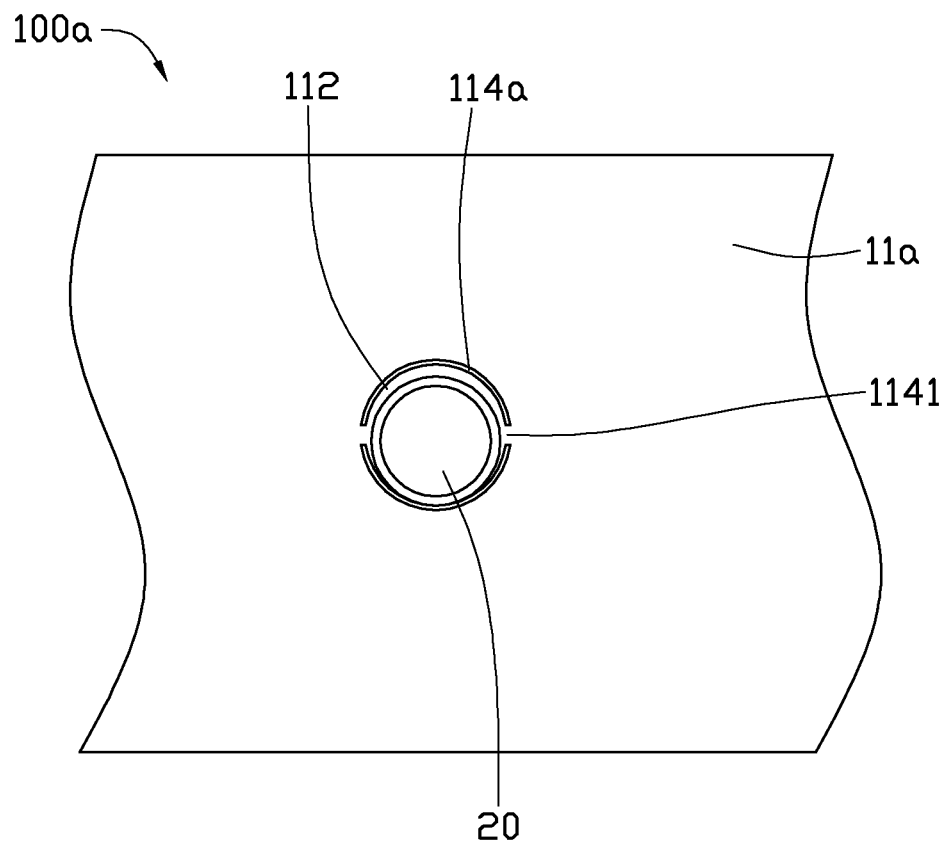
FIG. 7 is a schematic, front view of part of a heat dissipation apparatus preform before a punching process of a method for manufacturing the heat dissipation apparatus in accordance with a third embodiment of the present disclosure.

Referring to FIG. 7, this is a front view of part of a heat dissipation apparatus 100a before a punching process of a method for manufacturing the heat dissipation apparatus 100a in accordance with a third embodiment of the present disclosure. In this embodiment, a collar 114a of each fin 11a of the heat dissipation apparatus 100a defines two slots 1141 therein. Each of the slots 1141 is strip-shaped, and extends parallel to an axis of the collar 114a. The two slots 1141 of the collar 114a face each other to divide the collar 114a into two equal parts. This allows the collar 114a to shrink more easily during the punching process. When the punching process is completed, the two slots 1141 of the collar 114a are substantially closed due to the shrinkage of the collar 114a. In this embodiment, the collar 114a defines two slots 1141. Understandably, in other embodiments, one slot 1141 or more than two slots 1141 can be defined in the collar 114a.

It is to be understood, however, that even though numerous characteristics and advantages of the exemplary embodiments have been set forth in the foregoing description, together with details of the structures and functions of the embodiments, the disclosure is illustrative only; and that changes may be made in detail, especially in matters of shape, size, and arrangement of parts within the principles of the embodiments to the full extent indicated by the broad general meaning of the terms in which the appended claims are expressed.

What is claimed is:

1. A method for manufacturing a heat dissipation apparatus, the method comprising:
   providing a fin assembly comprising a plurality of fins stacked together and spaced from each other, each of the fins defining a through hole therein, a collar extending outwardly from each fin at an edge of the through hole;
   providing a heat pipe with an outer diameter less than that of the through hole, and inserting the heat pipe in the through hole of each fin;
   providing a first punching tool and a second punching tool, the first punching tool being identical to the second punching tool, each of the first punching tool and the second punching tool comprising a handle portion and a plurality of punching units, the punching units of the first punching tool and the second punching tool respectively extending from the handle portions of the first punching tool and the second punching tool, each of the punching units defining a recess in a free end thereof, each recess having an arc-shaped edge, the first punching tool and the second punching tool spaced from each other, and the recess of each punching unit of the first punching tool facing the recess of a corresponding punching unit of the second punching tool;
   placing the fin assembly between the first punching tool and the second punching tool, the collar of each fin located between the recess of a corresponding punching unit of the first punching tool and the recess of a corresponding punching unit of the second punching tool; and
   the punching units of the first punching tool and the corresponding punching units of the second punching tool punching corresponding collars of the fin assembly from two opposite sides, the collars shrinking inwardly and pressing the heat pipe to deform until the heat pipe is fittedly mounted in the collars of the fin assembly.

2. The method of claim 1, wherein a diameter of the heat pipe is 80% to 99% of an inner diameter of each collar before each collar is punched.

3. The method of claim 1, wherein an inner surface of the collar of each fin contacts the entire periphery of the heat pipe after a punching on the collar.

4. The method of claim 1, wherein the punching units of each of the first punching tool and the second punching tool are evenly spaced from each other, a distance between every two adjacent punching units of each of the first punching tool and the second punching tool in not less than a thickness of each fin, and each of the punching units has a thickness less than a distance between every two adjacent fins of the fin assembly.

5. The method of claim 1, wherein the first punching tool is placed above the second punching tool, the fin assembly is prefixed on the second punching tool, each fin of the fin assembly is located between every two adjacent two punching units of the second punching tool, and the collar of each fin is held in the recess of the corresponding punching unit of the second punching tool.

6. The method of claim 1, wherein the collar of each fin defines at least one slot therein along an axis thereof.

7. The method of claim 6, wherein when the punching of each collar is completed, the at least one slot is substantially closed due to the shrinkage of each collar.

8. The method of claim 6, wherein the at least one slot is strip-shaped and extends parallel to the axis of each collar.

9. The method of claim 6, wherein the at least one slot comprises two slots, and the two slots face each other to divide each collar into two equal parts.

10. The method of claim 1, wherein the recess of the punching unit of each of the first punching tool and the second punching tool has a shape chosen from a group comprising semicircular, arch-shaped and semi-elliptic.

11. The method of claim 10, wherein each recess is semicircular, and a diameter of each recess is less than an outer diameter of each collar but larger than an outer diameter of the heat pipe before each collar is punched.

12. The method of claim 11, wherein during punching of each collar, when the recess of each punching unit of the first punching tool and the recess of the corresponding punching unit of the second punching tool cooperatively define a circle, the collar of each fin just totally contacts the periphery of the heat pipe, and the heat pipe is fittedly mounted on the collar.

* * * * *